(12) United States Patent
Wang et al.

(10) Patent No.: US 8,963,202 B2
(45) Date of Patent: Feb. 24, 2015

(54) ELECTROSTATIC DISCHARGE PROTECTION APPARATUS

(75) Inventors: Chang-Tzu Wang, Taoyuan County (TW); Tien-Hao Tang, Hsinchu (TW); Kuan-Cheng Su, Taipei (TW)

(73) Assignee: United Microelectronics Corporation, Hsinchu (TW)

( * ) Notice: Subject to any disclaimer, the term of this patent is extended or adjusted under 35 U.S.C. 154(b) by 204 days.

(21) Appl. No.: 13/369,455

(22) Filed: Feb. 9, 2012

(65) Prior Publication Data

US 2013/0208379 A1    Aug. 15, 2013

(51) Int. Cl.
*H01L 23/62* (2006.01)
*H01L 27/02* (2006.01)
*H01L 29/74* (2006.01)

(52) U.S. Cl.
USPC .................. 257/173; 257/355; 257/E29.225; 361/56

(58) Field of Classification Search
CPC ............ H01L 27/0248; H01L 27/0259; H01L 27/0262
USPC ...................... 257/173, 355, E29.225; 361/56
See application file for complete search history.

(56) References Cited

U.S. PATENT DOCUMENTS

| | | | |
|---|---|---|---|
| 5,400,202 A | 3/1995 | Metz et al. | |
| 5,637,900 A | 6/1997 | Ker et al. | |
| 5,767,537 A * | 6/1998 | Yu et al. | 257/111 |
| 5,959,820 A | 9/1999 | Ker et al. | |
| 6,198,135 B1 | 3/2001 | Sonoda | |
| 6,724,677 B1 | 4/2004 | Su et al. | |
| 6,759,691 B2 * | 7/2004 | Chen | 257/107 |
| 6,850,397 B2 | 2/2005 | Russ et al. | |
| 6,909,149 B2 | 6/2005 | Russ et al. | |
| 7,009,252 B2 | 3/2006 | Lin et al. | |
| 7,027,276 B2 | 4/2006 | Chen | |
| 7,205,612 B2 | 4/2007 | Cai et al. | |
| 7,352,014 B2 * | 4/2008 | Van Camp | 257/173 |
| 7,368,761 B1 | 5/2008 | Lai et al. | |
| 7,498,615 B2 * | 3/2009 | Kuroda et al. | 257/173 |
| 7,671,415 B2 * | 3/2010 | Kuroda et al. | 257/355 |
| 7,672,100 B2 | 3/2010 | Van Camp | |
| 7,728,349 B2 * | 6/2010 | Boselli | 257/111 |
| 7,919,817 B2 * | 4/2011 | Mallikarjunaswamy | 257/355 |
| 2001/0007521 A1 * | 7/2001 | Chen | 361/56 |
| 2003/0034527 A1 * | 2/2003 | Amerasekera et al. | 257/355 |
| 2003/0052332 A1 * | 3/2003 | Chen | 257/173 |
| 2003/0076636 A1 | 4/2003 | Ker et al. | |
| 2003/0218841 A1 * | 11/2003 | Kodama | 361/56 |
| 2005/0082616 A1 * | 4/2005 | Chen et al. | 257/350 |

(Continued)

*Primary Examiner* — Cheung Lee
*Assistant Examiner* — Jeremy Joy
(74) *Attorney, Agent, or Firm* — WPAT, PC; Justin King

(57) ABSTRACT

A semiconductor ESD protection apparatus comprises a substrate; a first doped well disposed in the substrate and having a first conductivity; a first doped area having the first conductivity disposed in the first doped well; a second doped area having a second conductivity disposed in the first doped well; and an epitaxial layer disposed in the substrate, wherein the epitaxial layer has a third doped area with the first conductivity and a fourth doped area with the second conductivity separated from each other. Whereby a first bipolar junction transistor (BJT) equivalent circuit is formed between the first doped area, the first doped well and the third doped area; a second BJT equivalent circuit is formed between the second doped area, the first doped well and the fourth doped area; and the first BJT equivalent circuit and the second BJT equivalent circuit have different majority carriers.

19 Claims, 9 Drawing Sheets

(56) References Cited

U.S. PATENT DOCUMENTS

| | | | |
|---|---|---|---|
| 2005/0082626 A1* | 4/2005 | Leedy | 257/432 |
| 2005/0224836 A1* | 10/2005 | Tseng | 257/107 |
| 2006/0267102 A1 | 11/2006 | Cheng et al. | |
| 2007/0090392 A1* | 4/2007 | Boselli | 257/107 |
| 2007/0096213 A1* | 5/2007 | Tsai et al. | 257/355 |
| 2008/0217650 A1* | 9/2008 | Morishita | 257/173 |
| 2008/0253046 A1* | 10/2008 | Lou et al. | 361/56 |
| 2008/0296613 A1* | 12/2008 | Chuang | 257/173 |
| 2009/0236631 A1* | 9/2009 | Chen et al. | 257/109 |
| 2011/0180845 A1* | 7/2011 | Mallikarjunaswamy | 257/173 |
| 2012/0175672 A1* | 7/2012 | Ritter | 257/112 |

* cited by examiner

ELECTROSTATIC DISCHARGE PROTECTION APPARATUS

FIELD OF THE INVENTION

The present invention relates to an electrostatic discharge (ESD) protection apparatus, and more particularly to a semiconductor ESD protection apparatus for integrated circuits (IC).

BACKGROUND OF THE INVENTION

An ESD event commonly results from the discharge of a high voltage potential and leads to pulses of high current in a short duration (typically, 100 nanoseconds). Semiconductor IC is vulnerable to ESD events resulted by human contact with the leads of the IC or electrically charged machinery being discharged in other leads of the IC. Accordingly, an ESD protection circuit is essential to a semiconductor IC.

A parasitic silicon controlled rectifier (SCR) is one kind of on-chip semiconductor ESD protection device. Due to its high current sinking/sourcing capability, very low turn-on impedance, low power dissipation, and large physical volume for heat dissipating, parasitic lateral SCR devices have been recognized in the prior art as one of the most effective elements in semiconductor ESD protection circuits.

However, there is a major disadvantage with using the parasitic SCR device in ESD protection circuits, in that the parasitic SCR device has a high trigger voltage which could obstruct the parasitic SCR turning on timely to protect the semiconductor IC. Thus, in practice, some secondary protection elements, such as a field planted diode and a diffusion resistor, have to be incorporated with the lateral SCR device in order to provide an improved ESD protection. As a result, some additional processing steps and production cost for fabricating those elements may be required, and the layout size of the semiconductor IC can not be reduced.

Therefore, there is a need of providing an advanced semiconductor ESD protection apparatus in order to obviate the drawbacks and problems encountered from the prior art.

SUMMARY OF THE INVENTION

Therefore, one aspect of the present invention is to provide a semiconductor ESD protection apparatus, wherein the semiconductor ESD protection apparatus comprises a substrate, a first doped well, a first doped area, a second doped area and an epitaxial layer. The first doped well is disposed in the substrate and has a first conductivity. The first doped area has the first conductivity and is disposed in the first doped well. The second doped area has a second conductivity and is disposed in the first doped well. The epitaxial layer is disposed in the substrate and has a third doped area with the first conductivity and a fourth doped area with the second conductivity, wherein the fourth doped area is separated from the third doped area. A first bipolar junction transistor (BJT) equivalent circuit is formed between the first doped area, the first doped well and the third doped area; a second BJT equivalent circuit is formed between the second doped area, the first doped well and the fourth doped area; and the first BJT equivalent circuit and the second BJT equivalent circuit have different majority carriers.

In one embodiment of the present invention, the epitaxial layer further comprises a first isolating area used to separate the third doped area, the fourth doped area and the substrate, wherein the first isolating area has a doping concentration substantially less than that of the fourth doped area. In one embodiment of the present invention, the first isolating area has the second conductivity, and the doping concentration of the first isolating area is substantially greater than or equal to 0. In one embodiment of the present invention, the epitaxial layer is made of silicon germanium (SiGe).

In one embodiment of the present invention, the first conductivity is N-type and the second conductivity is P-type, whereby the first BJT equivalent circuit is an NPN BJT equivalent circuit and the second BJT equivalent circuit is a PNP BJT equivalent circuit. In one embodiment of the present invention, the second doped area consists of SiGe.

In one embodiment of the present invention, the first doped area and the second doped area are involved in a silicon carbide (SiC) epitaxial layer, wherein the SiC epitaxial layer further comprises a second isolating area used to separate the first doped area, the second doped area and the first doped well; and the second isolating area has a doping concentration substantially less than that of the first doped area. In one embodiment of the present invention, the second isolating area is an N-type area having the doping concentration substantially greater than or equal to 0.

In one embodiment of the present invention, the semiconductor ESD protection apparatus further comprises a second doped well having the second conductivity and disposed in the substrate, wherein the epitaxial layer is disposed in the second doped well, and the first isolating area is used to separate the third doped area, the fourth doped area and the second doped well. In one embodiment of the present invention, the first conductivity is N-type and the second conductivity is P-type, whereby the first BJT equivalent circuit is an NPN BJT equivalent circuit and the second BJT equivalent circuit is a PNP BJT equivalent circuit.

In one embodiment of the present invention, the epitaxial layer consists of SiC; the first conductivity is P-type and the second conductivity is N-type, whereby the first BJT equivalent circuit is a PNP BJT equivalent circuit and the second BJT equivalent circuit is an NPN BJT equivalent circuit. In one embodiment of the present invention, the second doped area consists of a SiC.

In one embodiment of the present invention, the first doped area and the second doped area are involved in a SiC epitaxial layer, wherein the SiC epitaxial layer further comprises a second isolating area used to separate the first doped area, the second doped area and the first doped well; and the second isolating area has a doping concentration substantially less than that of the first doped area. In one embodiment of the present invention, the second isolating area is a P-type area having the doping concentration substantially greater than or equal to 0.

In one embodiment of the present invention, the semiconductor ESD protection apparatus further comprises a second doped well having the second conductivity and disposed in the substrate, wherein the epitaxial layer is disposed in the second doped well, and the first isolating area is used to separate the third doped area, the fourth doped area and the second doped well. In one embodiment of the present invention, the first conductivity is P-type and the second conductivity is N-type, whereby the first BJT equivalent circuit is a PNP BJT equivalent circuit and the second BJT equivalent circuit is an NPN BJT equivalent circuit.

In one embodiment of the present invention, the first doped area and the second doped area are involved in a SiGe epitaxial layer, wherein the SiGe epitaxial layer further comprises a second isolating area used to separate the first doped area, the second doped area and the first doped well; and the second isolating area has a doping concentration substantially less than that of the first doped area. In one embodiment of the present invention, the second isolating area is a P-type area having the doping concentration substantially greater than or equal to 0.

In accordance with aforementioned embodiments, an improved semiconductor ESD protection apparatus which has a SCR device comprising a PNP BJT equivalent circuit and an NPN BJT equivalent circuit is provided, wherein at least one P/N junction in contact with the cathode/anode of the parasitic SCR device is formed by epitaxial material with a doping concentration less than that of the cathode/anode, whereby the resistance of the circuit used to connect the PNP/NPN BJT equivalent circuit with the cathode/anode can be increased, on one hand; and the carrier mobility of the PNP/NPN BJT equivalent circuit can be increased by the compression or tensile stress due to the formation of the epitaxial material in the silicon substrate, on another hand. As a result, the trigger voltage of the parasitic SCR device can be reduced significantly, so as to provide improved ESD protection for a semiconductor IC involving the semiconductor ESD protection apparatus therein. Therefore the process for fabricating the semiconductor IC can be simplified, and the layout size and the manufacturing cost of the semiconductor IC can be reduced.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

An improved semiconductor ESD protection apparatus device is provided in order to reduce a trigger voltage of a SCR device involved in the semiconductor ESD protection apparatus, whereby an improved ESD protection can be provided. The present invention will now be described more specifically with reference to the following embodiments. It is to be noted that the following descriptions of preferred embodiments of this invention are presented herein for the purpose of illustration and description only. It is not intended to be exhaustive or to be limited to the precise form disclosed.

Figure 1:
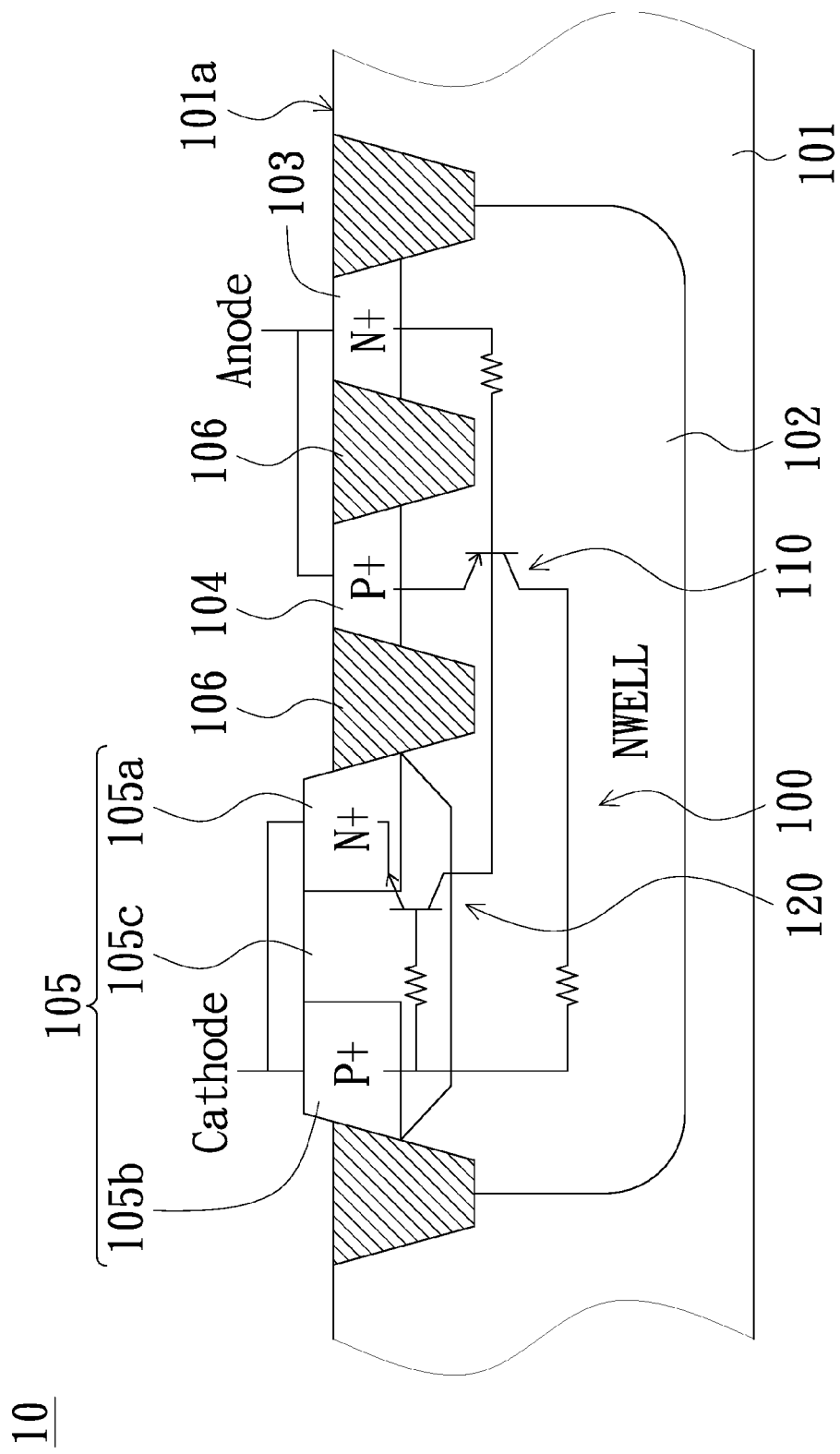
FIG. 1 is a cross-sectional view illustrating a semiconductor ESD protection apparatus having a SCR device in accordance with one embodiment of the present invention.

FIG. 1 is a cross-sectional view illustrating a semiconductor ESD protection apparatus 10 having a SCR device 100 in accordance with one embodiment of the present invention. The semiconductor ESD structure 10 comprises a substrate 101, a doped well 102, a doped area 103, a doped area 104 and an epitaxial layer 105. The substrate 101 is a P-type doped silicon substrate. The doped well 102 is doped with N-type dopants (referred as N well) and extends downwards into the substrate 101 from a surface 101a of the substrate 101. The doped area 103 is an N-type area (referred as N+) extending downwards into the doped well 102 from the surface 101a and having a doping concentration substantially greater than that of the doped well 102. The doped area 104 is a P-type area (referred as P+) extending downwards into the doped well 102 from the surface 101a and separated from the doped area 103 by a shallow trench isolator (STI) 106.

The epitaxial layer 105 which is embedded in the substrate 101 and extends outwards through the surface 101a of the substrate 101 is separated from the doped areas 104 and 103 by another STI 106. The epitaxial layer 105 comprises a doped area 105a, a doped area 105b and an isolating area 105c. The doped area 105a is a N-type area (referred as N+) having a doping concentration substantially greater than that of the doped well 102; the doped area 105b is a P-type area (referred as P+); and the doped area 105a and doped area 105b both extend downwards into the doped well 102 from the surface 101a of the substrate 101. The isolating area 105c is used to separate the doped area 105a, the doped area 105b and the doped well 102 from each other.

In some embodiments of the present invention, the epitaxial layer 105 consists of SiGe, wherein the isolating area 105c can be either undoped or doped with P-type dopants. In the present embodiment, the isolating area 105c is doped with P-type dopants having a concentration substantially less than that doped in the doped area 105b.

By forming the aforementioned structure, a PNP BJT 110 equivalent circuit can be configured between the doped area 104, the doped well 102, the isolating area 105c and the doped area 105b, and an NPN BJT 120 equivalent circuit can be configured between the doped area 103, the doped well 102, the isolating area 105c and the doped area 105a, while a SCR device 100 is defined in the semiconductor ESD protection apparatus 10 used to provide ESD protection for other device (not shown) formed on the substrate 101.

In the present embodiment, the doped area 104, the doped well 102 and the isolating area 105c respectively serve as the emitter (E), the base (B) and the collector (C) of the PNP BJT 110, and the doped area 105a, the isolating area 105c and the doped well 102 respectively serve as the emitter, the base and the collector of the NPN BJT 120. The doped area 103 and the doped area 104 are electrically in contact with the anode of the SCR 100, and the doped 105a and the doped area 105b are electrically in contact with the cathode of the SCR 100.

Since the isolating area 105c which is electrically connected to the cathode (through the doped area 105b) and serves as the base of the NPN BJT 120 has a doping concentration less than that of the doped area 105b, thus the resistance of the circuit used to connect the NPN BJT 120 with the cathode of the SCR device 100 can be increased, such that the trigger voltage of the SCR device 100 can be decreased significantly.

Besides, the trigger voltage of the SCR device 100 can be further decreased, in that, the carrier mobility (holes mobility) of the PNP BJT 110 can be increased by the compression stress which is imposed on the doped well 102 due to the formation of the SiGe epitaxial layer 105.

Figure 2:
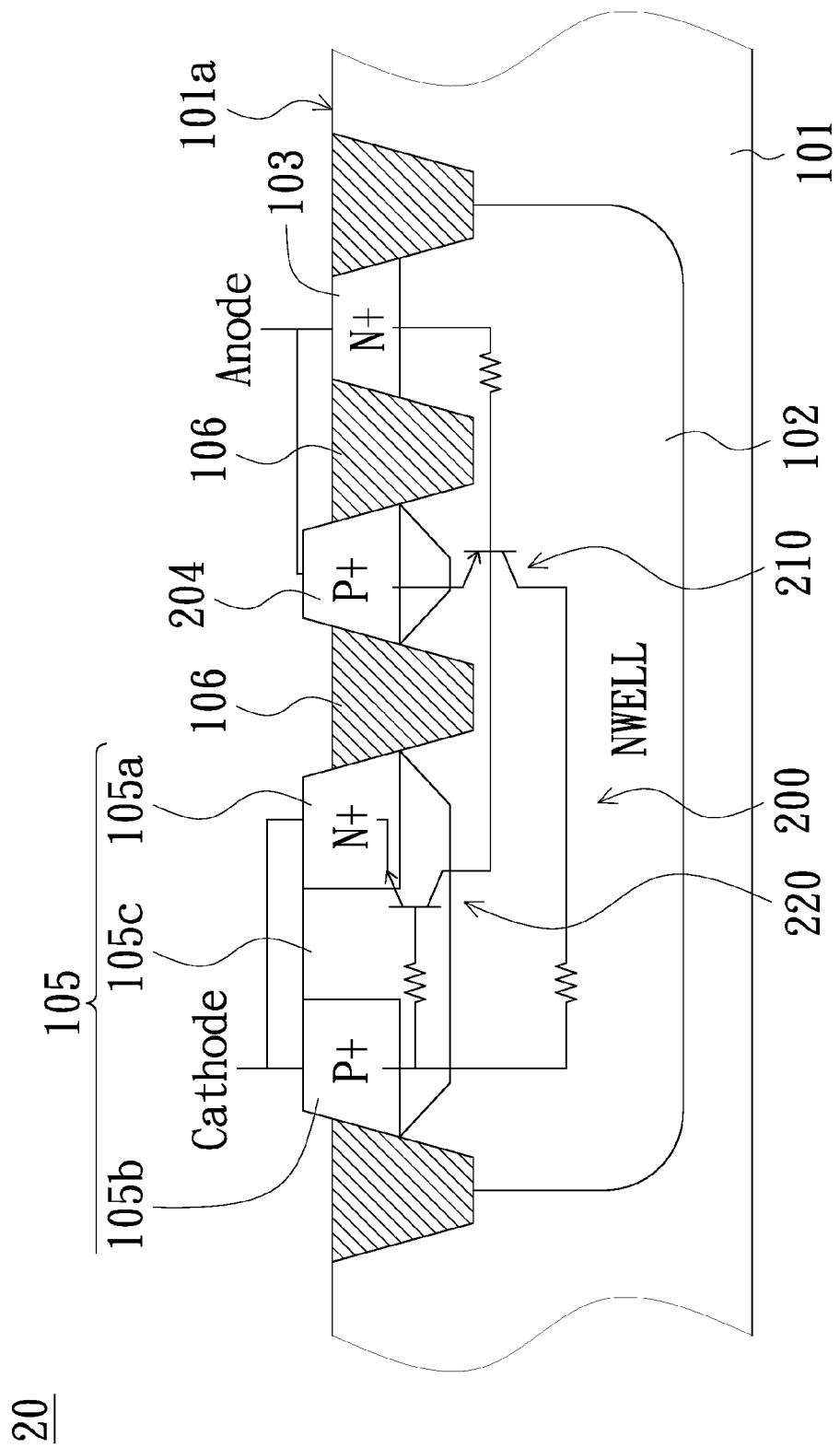
FIG. 2 is a cross-sectional view illustrating a semiconductor ESD protection apparatus having a SCR device in accordance with one embodiment of the present invention.

FIG. 2 is a cross-sectional view illustrating a semiconductor ESD protection apparatus 20 having a SCR device 200 in accordance with one embodiment of the present invention. The fundamental structure of the semiconductor ESD protection apparatus 10 is similar to that of the semiconductor ESD protection apparatus 20. The difference of these two semiconductor ESD protection apparatuses is that the doped area 204 of the semiconductor ESD protection apparatus 20 consists of SiGe rather than silicon as the semiconductor ESD protection apparatus 10 applies. The SiGe based doped area 204 and the epitaxial layer 105 may provide more compression stress to improve the carrier mobility (holes mobility) of the PNP BJT 210, such that the trigger voltage of the SCR device 200 configured by the PNP BJT 210 and the NPN BJT 220 can be further decreased.

Figure 3:
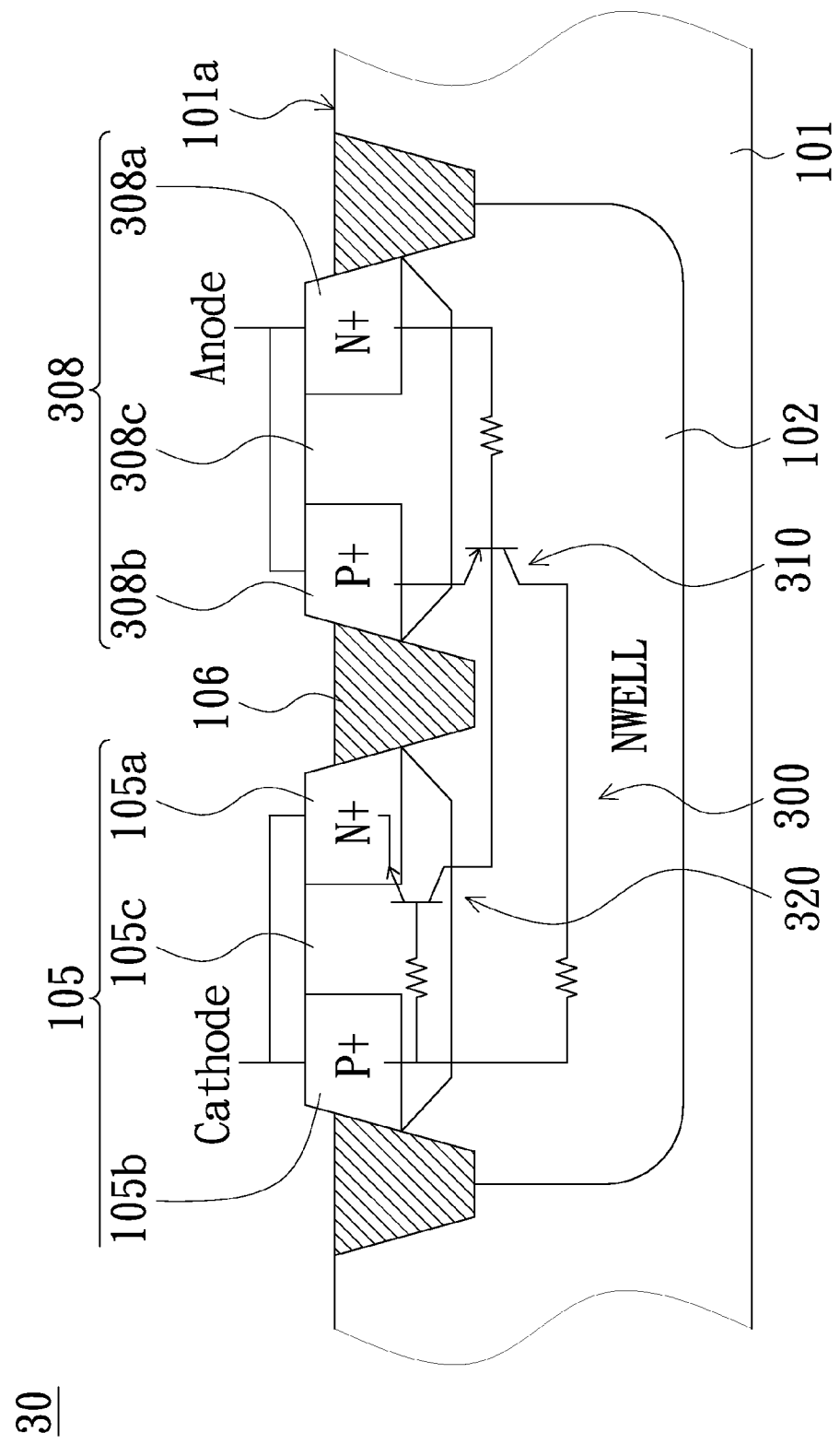
FIG. 3 illustrates a cross-sectional view of a semiconductor ESD protection apparatus having a SCR device in accordance with one embodiment of the present invention.

In some embodiments of the present invention, the material consisting of the doped area 103 and the doped area 104 of the semiconductor ESD protection apparatus 10 may be substituted by SiC. For example, FIG. 3 illustrates a cross-sectional view of a semiconductor ESD protection apparatus 30 having a SCR device 300 in accordance with one embodiment of the present invention. Wherein the structure of the semiconductor ESD protection apparatus 30 is identical with that of the semiconductor ESD protection apparatus 10 except of the epitaxial layer 308 consisting of SiC.

In the present embodiment, the epitaxial layer 308 comprises a doped area 308a, a doped area 308b and an isolating area 308c. The doped area 308a is a N-type area (referred as N+) having a doping concentration substantially greater than that of the doped well 102; the doped area 308b is a P-type area (referred as P+); and the isolating area 308c is used to separate the doped area 308a, the doped area 308b and the doped well 102 from each other.

In some embodiments of the present invention, the epitaxial layer 308 consists of SiC, wherein the isolating area 308c can be either undoped or doped with N-type dopants. In the present embodiment, the isolating area 308c is doped with N-type dopants having a concentration substantially less than that doped in the doped area 308a and the doped well 102.

By forming the aforementioned structure, a PNP BJT 310 equivalent circuit can be configured between the doped area 308b, the isolating area 308c, the doped well 102, the isolating area 105c and the doped area 105b, and an NPN BJT 320 equivalent circuit can be configured between doped area 105a, the isolating area 105c, the doped well 102, the isolating area 308c and the doped area 308a, while a SCR device 300 is defined in the semiconductor ESD protection apparatus 30 used to provide ESD protection for other device (not shown) formed on the substrate 101.

In the present embodiment, the isolating area 308c, the doped well 102 and the isolating area 105c respectively serve as the emitter, the base and the collector of the PNP BJT 310, and the doped area 105a, the isolating area 105c and the doped well 102 respectively serve as the emitter, the base and the collector of the NPN BJT 320. The doped area 308a and the doped area 308b are electrically in contact with the anode of the SCR 300, and the doped 105a and the doped area 105b are electrically in contact with the cathode of the SCR 300.

Since the isolating area 105c which is electrically connected to the cathode (through the doped area 105b) and serves as the base of the NPN BJT 320 has a doping concentration less than that of the doped area 105b, thus the resistance of the circuit used to connect the NPN BJT 320 with the cathode of the SCR device 300 can be increased, such that the trigger voltage of the SCR device 300 can be decreased significantly. Similarly, since the isolating area 308c which is electrically connected to the anode (through the doped area 308b) and serves as the emitter of the PNP BJT 310 has a doping concentration less than that of the doped area 308b, thus the resistance of circuit connecting the PNP BJT 310 with the anode of the SCR device 300 can be increased. Accordingly, a synergistic effect for decreasing the trigger voltage of the SCR device 300 can be obtained.

Figure 4:
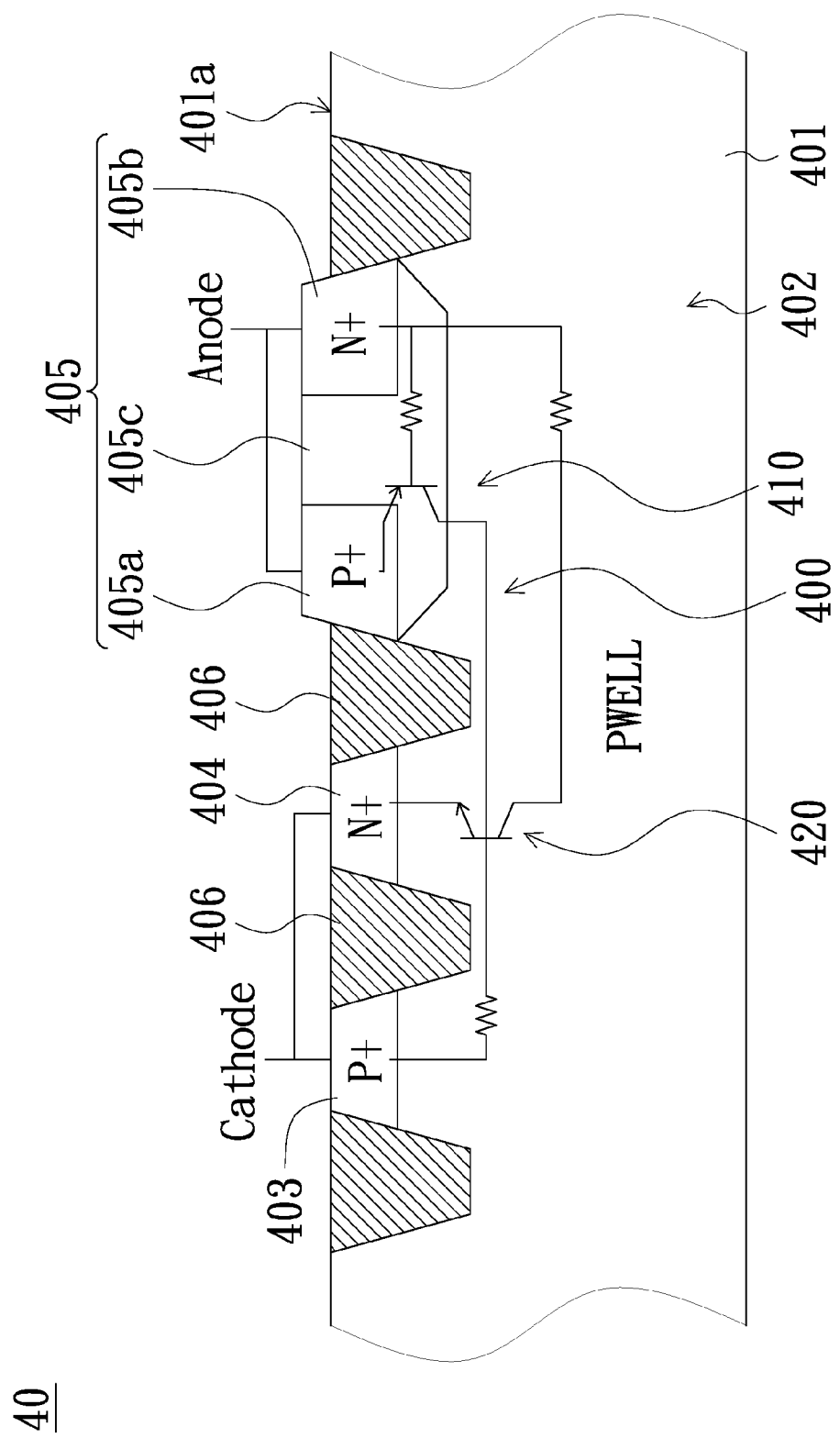
FIG. 4 is a cross-sectional view illustrating a semiconductor ESD protection apparatus having a SCR device in accordance with one embodiment of the present invention.

FIG. 4 is a cross-sectional view illustrating a semiconductor ESD protection apparatus 40 having a SCR device 400 in accordance with one embodiment of the present invention. The semiconductor ESD structure 40 comprises a substrate 401, a doped well 402, a doped area 403, a doped area 404 and an epitaxial layer 405. The substrate 401 is a P-type doped silicon substrate. The doped well 402 is doped with P-type dopants (referred as P well) and extends downwards into the substrate 401 from a surface 401a of the substrate 401. The doped area 403 is a P-type area (referred as P+) extending downwards into the doped well 402 from the surface 401a of the substrate 401 and having a doping concentration greater than that of the doped well 402. The doped area 404 is an N-type area (referred as N+) extending downwards into the doped well 402 from the surface 401a and separated from the doped area 403 by a STI 406.

The epitaxial layer 405 which is embedded in the substrate 401 and extends outwards through the surface 401a of the substrate 401 is separated from the doped areas 404 and 403 by another STI 406. The epitaxial layer 405 comprises a doped area 405a, a doped area 405b and an isolating area 405c. The doped area 405a is a P-type area (referred as P+) having a doping concentration substantially greater than that of the doped well 402; the doped area 405b is an N-type area (referred as N+); and the doped area 405a and doped area 405b both extend downwards into the doped well 402 from the surface 401a of the substrate 401. The isolating area 405c is used to separate the doped area 405a, the doped area 405b and the doped well 402 from each other.

In some embodiments of the present invention, the epitaxial layer 405 consists of SiC, wherein the isolating area 405c can be either undoped or doped with N-type dopants. In the present embodiment, the isolating area 405c is doped with N-type dopants having a concentration substantially less than that doped in the doped area 405b.

By forming the aforementioned structure, a PNP BJT 410 equivalent circuit can be configured between the doped area 403, the doped well 402, the isolating area 405c and the doped area 405a, and an NPN BJT 420 equivalent circuit can be configured between the doped area 404, the doped well 402, the isolating area 405c and the doped area 405b, while a SCR device 400 is defined in the semiconductor ESD protection apparatus 40 used to provide ESD protection for other device (not shown) formed in substrate 401.

In the present embodiment, the doped area 405a, the isolating area 405c and the doped well 402 respectively serve as the emitter, the base and the collector of the PNP BJT 410, and the doped area 404, the doped well 402 and the isolating area 405c respectively serve as the emitter, the base and the collector of the NPN BJT 420. The doped area 403 and the doped area 404 are electrically in contact with the cathode of the SCR 400, and the doped 405a and the doped area 405b are electrically in contact with the anode of the SCR 400.

Since the isolating area 405c which is electrically connected to the anode (through the doped area 405b) and serves as the base of the PNP BJT 410 has a doping concentration less than that of the doped area 405b, thus the resistance of the circuit used to connect the PNP BJT 410 and the anode of the SCR device 400 can be increased, such that the trigger voltage of the SCR device 400 can be decreased significantly.

Besides, the trigger voltage of the SCR device 400 can be further decreased, in that, the carrier mobility (electrons mobility) of the NPN BJT 420 can be increased by the tensile stress which is imposed on the doped well 402 due to the formation of the SiC epitaxial layer 405.

Figure 5:
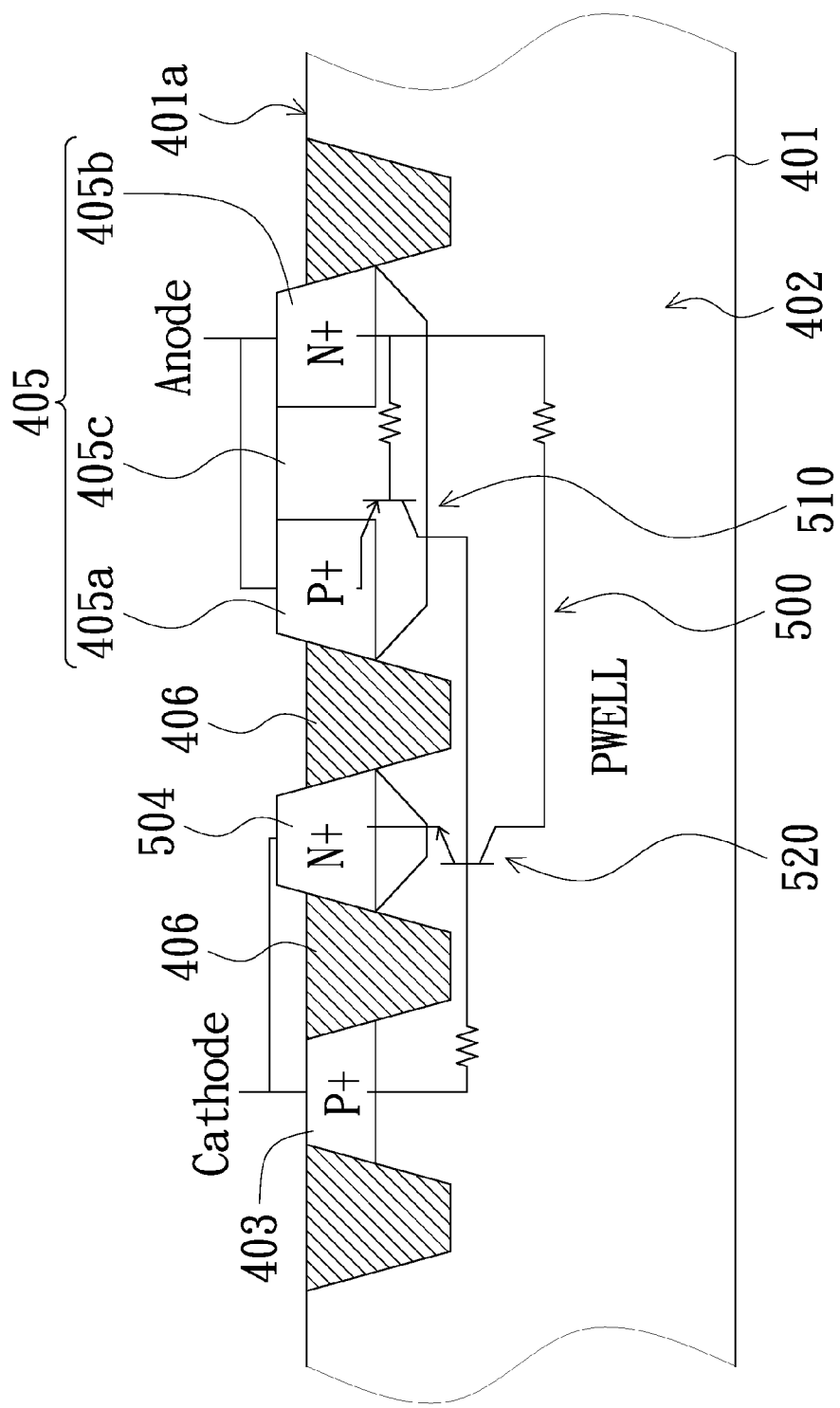
FIG. 5 is a cross-sectional view illustrating a semiconductor ESD protection apparatus having a SCR device in accordance with one embodiment of the present invention.

FIG. 5 is a cross-sectional view illustrating a semiconductor ESD protection apparatus 50 having a SCR device 500 in accordance with one embodiment of the present invention. The fundamental structure of the semiconductor ESD protection apparatus 50 is similar to that of the semiconductor ESD protection apparatus 40. The difference of these two semiconductor ESD protection apparatuses is that the doped area 504 of the semiconductor ESD protection apparatus 50 consists of SiC rather than silicon as the semiconductor ESD protection apparatus 40 applies. The SiC based doped area 504 and the epitaxial layer 405 may provide more tensile stress to improve the carrier mobility (electrons mobility) of the NPN BJT 520, such that the trigger voltage of the SCR device 500 configured by the PNP BJT 510 and the NPN BJT 520 can be further decreased.

Figure 6:
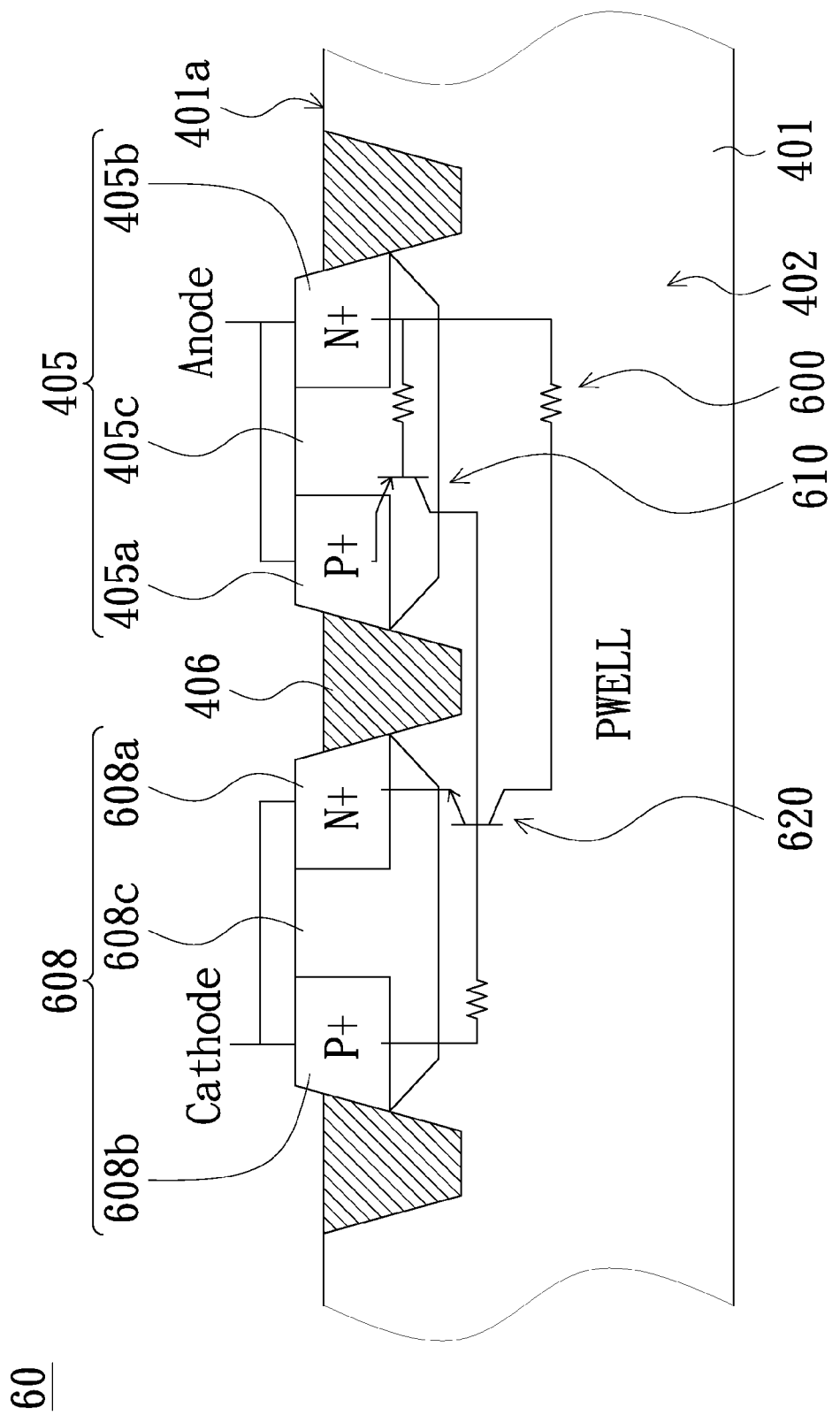
FIG. 6 is a cross-sectional view illustrating a semiconductor ESD protection apparatus having a SCR device in accordance with one embodiment of the present invention.

In some embodiments of the present invention, the material consisting of the doped area 403 and the doped area 404 of the semiconductor ESD protection apparatus 40 may be substituted by SiGe. For example, FIG. 6 illustrates a cross-sectional view of a semiconductor ESD protection apparatus 60 having a SCR device 600 in accordance with one embodiment of the present invention. Wherein the structure of the semiconductor ESD protection apparatus 60 is identical with that of the semiconductor ESD protection apparatus 40 except of the epitaxial layer 608 consisting of SiGe.

In the present embodiment, the epitaxial layer 608 comprises a doped area 608a, a doped area 608b and an isolating area 608c. The doped area 608a is a N-type area (referred as N+); the doped area 608b is a P-type area having a doping concentration substantially greater than that of the doped well 402 (referred as P+); and the isolating area 608c is used to separate the doped area 608a, the doped area 608b and the doped well 402 from each other.

In some embodiments of the present invention, the epitaxial layer 608 consists of SiGe, wherein the isolating area 608c can be either undoped or doped with P-type dopants. In the present embodiment, the isolating area 608c is doped with P-type dopants having a concentration substantially less than that doped in the doped area 608b and the doped well 402.

By forming the aforementioned structure, a PNP BJT 610 equivalent circuit can be configured between the doped area 405a, the isolating area 405c, the doped well 402, the isolating area 608c and the doped area 608b, and an NPN BJT 620 equivalent circuit can be configured between the doped area 608a, the isolating area 608c, the doped well 402, the isolating area 405c and the doped area 405b, while a SCR device 600 is defined in the semiconductor ESD protection apparatus 60 used to provide ESD protection for other device (not shown) formed on the substrate 401.

In the present embodiment, the doped area 405a, the isolating area 405c and the doped well 402 respectively serve as the emitter, the base and the collector of the PNP BJT 610, and the isolating area 608c, the doped well 402 and the isolating area 405c respectively serve as the emitter, the base and the collector of the PNP BJT 620. The doped area 608a and the doped area 608b are electrically in contact with the cathode of the SCR 600, and the doped area 405a and the doped area 405b are electrically in contact with the anode of the SCR 600.

Since the isolating area 405c which is electrically connected to the anode and serves as the base of the PNP BJT 610 has a doping concentration less than that of the doped area 405a, thus resistance of the circuit used to connect the PNP BJT 610 and the anode of the SCR device 600 can be increased, such that the trigger voltage of the SCR device can be decreased significantly. Similarly, the trigger voltage of the SCR device 600 can be further decreased, because the isolating area 608c which is electrically connected to the cathode and serves as the emitter of the PNP BJT 610 has a doping concentration less than that of the doped area 608b can cause resistance of the circuit used to connect the NPN BJT 620 with the cathode of the SCR device 600 increased. Accordingly a synergistic effect for decreasing the trigger voltage of the SCR device 600 can be obtained.

Figure 7:
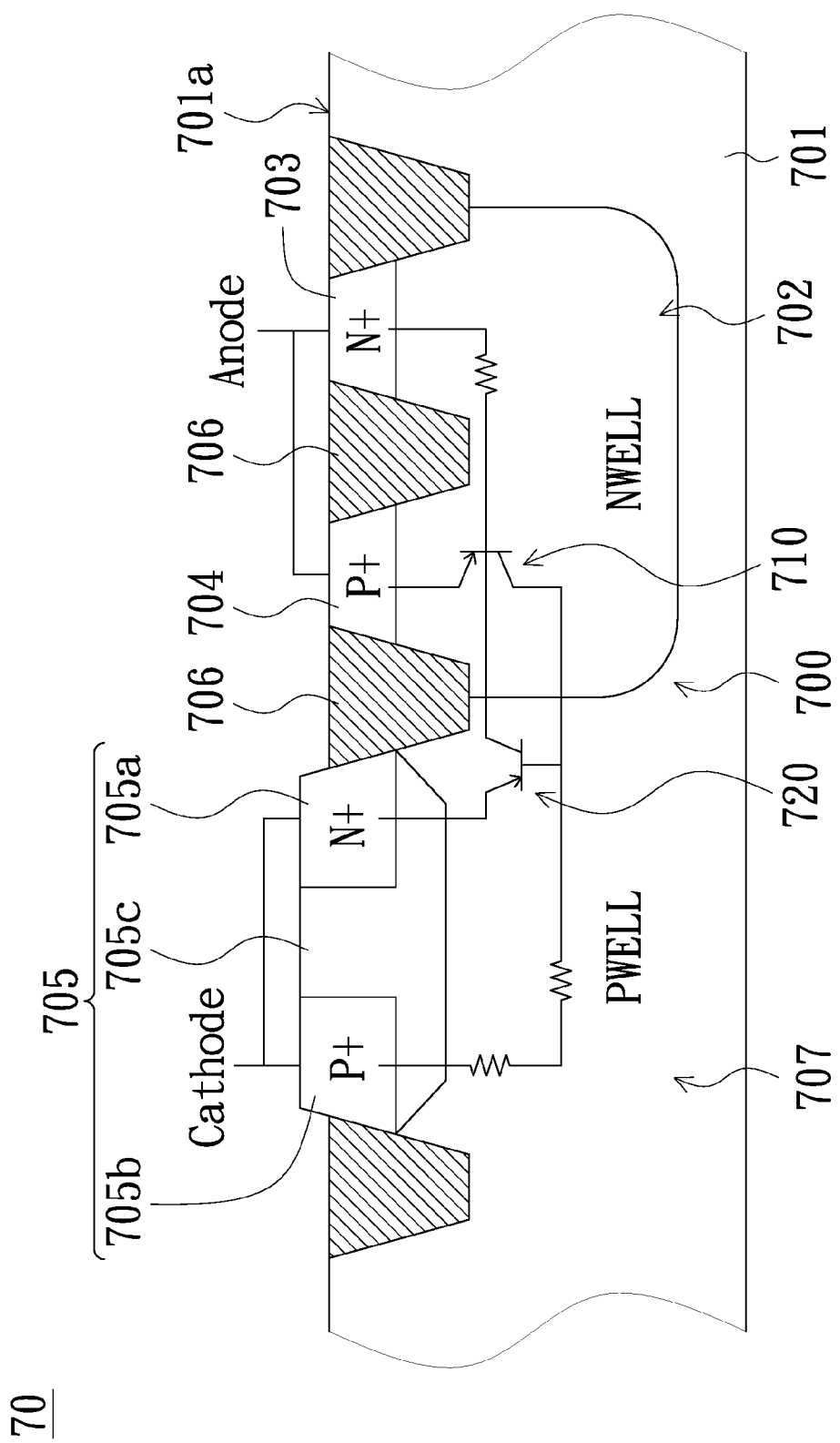
FIG. 7 is a cross-sectional view illustrating a semiconductor ESD protection apparatus having a SCR device in accordance with one embodiment of the present invention.

FIG. 7 is a cross-sectional view illustrating a semiconductor ESD protection apparatus 70 having a SCR device 700 in accordance with one embodiment of the present invention. The semiconductor ESD structure 70 comprises a substrate 701, a doped well 702, a doped well 707, a doped area 703, a doped area 704 and an epitaxial layer 705. The substrate 701 is a P-type doped silicon substrate. The doped well 702 is doped with N-type dopants (referred as N well) and extends downwards into the substrate 701 from a surface 701a of the substrate 701. The doped well 707 is a P-type doped region and also extends downwards into the substrate 701 from the surface 701a of the substrate 701 (referred as P well).

The doped area 703 is an N-type area (referred as N+) extending downwards into the doped well 702 from the surface 701a and having a doping concentration substantially greater than that of the doped well 702. The doped area 704 is a P-type area (referred as P+) extending downwards into the doped well 702 from the surface 701a and separated from the doped area 703 by a STI 706.

The epitaxial layer 705 extends downwards into the doped well 707 from the surface 701a of the substrate 701 and is separated from the doped areas 704 and 703 by another STI 706. The epitaxial layer 705 comprises a doped area 705a, a doped area 705b and an isolating area 705c. The doped area 705a is an N-type area (referred as N+); and the doped area 705b is a P-type area (referred as P+) having a doping concentration substantially greater than that of the doped well 707. The isolating area 705c is used to separate the doped area 705a, the doped area 705b and the doped well 707 from each other.

In some embodiments of the present invention, the epitaxial layer 705 consists of SiGe, wherein the isolating area 705c can be either undoped or doped with P-type dopants. In the present embodiment, the isolating area 705c is doped with P-type dopants having a concentration substantially less than that doped in the doped area 705b.

By forming the aforementioned structure, a PNP BJT 710 equivalent circuit can be configured between the doped area 704, the doped well 702, the doped well 707, the isolating area 705c and the doped area 705b, and an NPN BJT 720 equivalent circuit can be configured between the doped area 703, the doped well 702, the doped well 707, the isolating area 705c and the doped area 705a, while a SCR device 700 is defined in the semiconductor ESD protection apparatus 70 used to provide ESD protection for other device (not shown) formed on the substrate 701.

In the present embodiment, the doped area 704, the doped well 702 and the doped well 707 respectively serve as the emitter, the base and the collector of the PNP BJT 710, and the isolating area 705c, the doped well 707 and the doped well 702 respectively serve as the emitter, the base and the collector of the NPN BJT 720. The doped area 703 and the doped area 704 are electrically in contact with the anode of the SCR 700, and the doped 705a and the doped area 705b are electrically in contact with the cathode of the SCR 700.

Since the isolating area 705c which is electrically connected to the cathode (through the doped area 705b) and serves as the emitter of the NPN BJT 720 has a doping concentration less than that of the doped area 705b and the doped well 707, thus the resistance of the circuit used to connect the NPN BJT 720 with the cathode of the SCR device 700 can be increased, such that the trigger voltage of the SCR device 700 can be decreased significantly.

Figure 8:
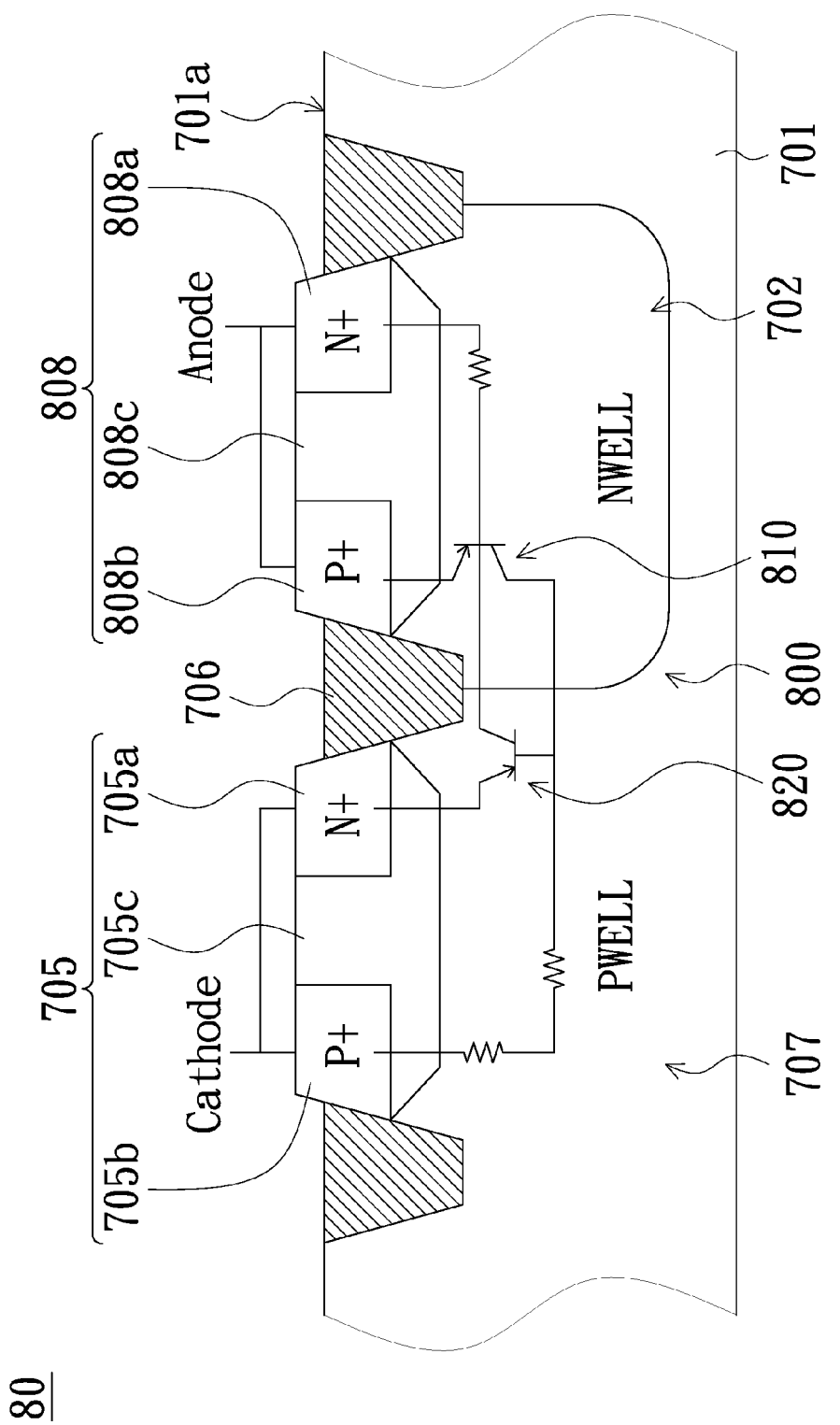
FIG. 8 is a cross-sectional view illustrating a semiconductor ESD protection apparatus having a SCR device in accordance with one embodiment of the present invention.

In some embodiments of the present invention, the material consisting of the doped area 703 and the doped area 704 of the semiconductor ESD protection apparatus 70 may be substituted by SiC epitaxial material. For example, FIG. 8 illustrates a cross-sectional view of a semiconductor ESD protection apparatus 80 having a SCR device 800 in accordance with one embodiment of the present invention. Wherein the structure of the semiconductor ESD protection apparatus 80 is identical with that of the semiconductor ESD protection apparatus 70 except of the epitaxial layer 808 consisting of SiC.

In the present embodiment, the epitaxial layer 808 comprises a doped area 808a, a doped area 808b and an isolating area 808c. The doped area 808a is an N-type area (referred as N+) having a doping concentration substantially greater than that of the doped well 702; the doped area 808b is a P-type area (referred as P+); and the isolating area 808c is used to separate the doped area 808a, the doped area 808b and the doped well 702 from each other.

In some embodiments of the present invention, the epitaxial layer 808 consists of SiC, wherein the isolating area 808c can be either undoped or doped with N-type dopants. In the present embodiment, the isolating area 808c is doped with N-type dopants having a concentration substantially less than that doped in the doped area 808a and the doped well 702.

By forming the aforementioned structure, a PNP BJT 810 equivalent circuit can be configured between the doped area 808b, the isolating area 808c, the doped well 702, the doped well 707, the isolating area 705c and the doped area 705b, and an NPN BJT 820 equivalent circuit can be configured between doped area 705a, the isolating area 705c, the doped well 707, the doped well 702, the isolating area 808c and the doped area 808a, while a SCR device 800 is defined in the semiconductor ESD protection apparatus 80 used to provide ESD protection for other device (not shown) formed on the substrate 701.

In the present embodiment, the isolating area 808c, the doped well 702 and the doped well 707 respectively serve as the emitter, the base and the collector of the PNP BJT 810, and the isolating area 705c, the doped well 707 and the doped well 702 respectively serve as the emitter, the base and the collector of the NPN BJT 820. The doped area 808a and the doped area 808b are electrically in contact with the anode of the SCR 800, and the doped 705a and the doped area 705b are electrically in contact with the cathode of the SCR 800.

Since the isolating area 705c which is electrically connected to the cathode (through the doped area 705b) and serves as the emitter of the NPN BJT 820 has a doping concentration less than that of the doped area 705b and the doped well 707, thus the resistance of the circuit used to connect the NPN BJT 820 with the cathode of the SCR device 800 can be increased, such that the trigger voltage of the SCR device 800 can be decreased significantly. Similarly the trigger voltage of the SCR device 800 can be further decreased, because the isolating area 808c which is electrically connected to the anode (through the doped area 808b) and serves as the emitter of the PNP BJT 810 has a doping concentration less than that of the doped area 808a can cause the resistance of the circuit connecting the PNP BJT 810 with the anode of the SCR device 800 increased. Accordingly, a synergistic effect for decreasing the trigger voltage of the SCR device 800 can be obtained.

Figure 9:
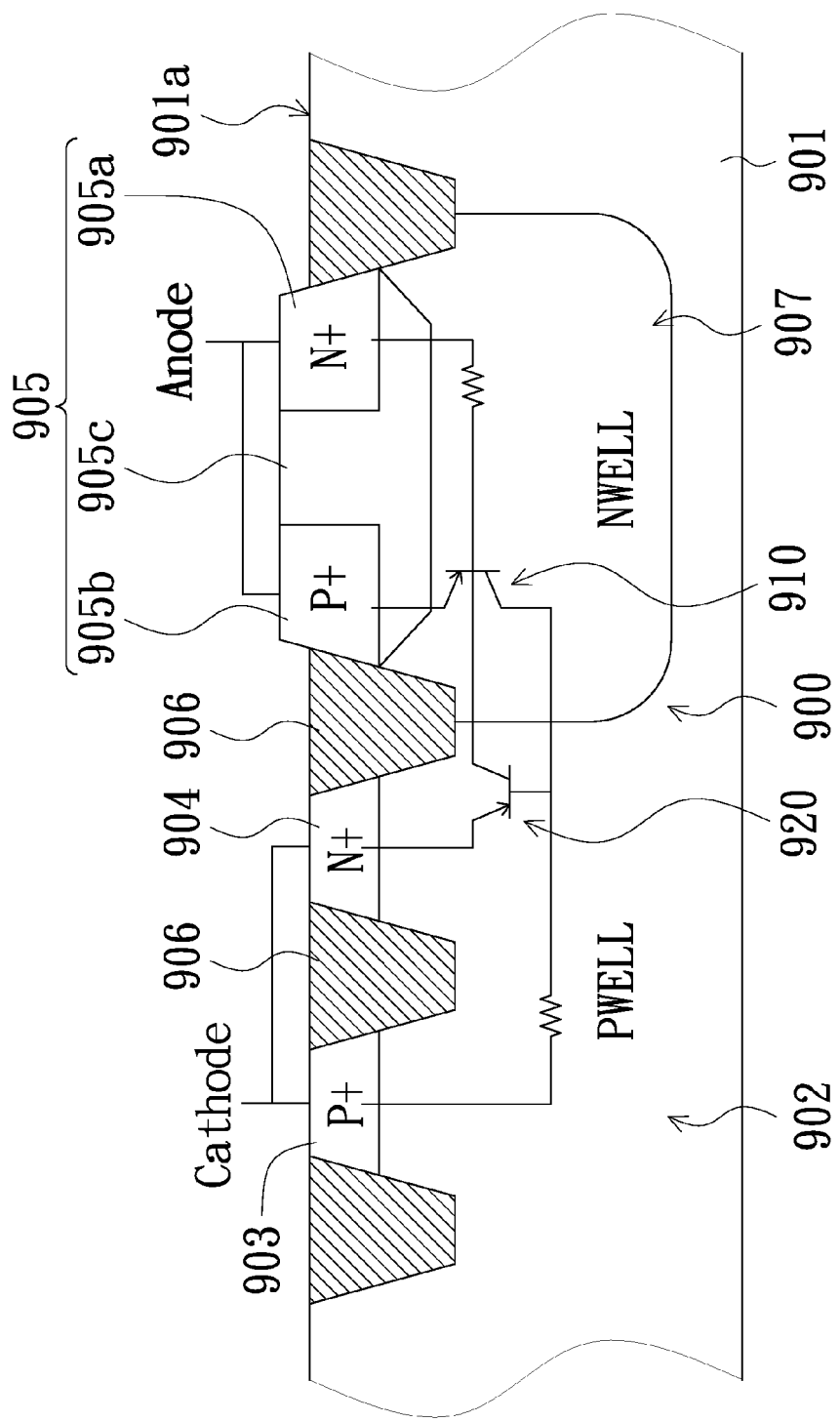
FIG. 9 is a cross-sectional view illustrating a semiconductor ESD protection apparatus having a SCR device in accordance with one embodiment of the present invention.

FIG. 9 is a cross-sectional view illustrating a semiconductor ESD protection apparatus 90 having a SCR device 900 in accordance with one embodiment of the present invention. The semiconductor ESD structure 90 comprises a substrate 901, a doped well 902, a doped well 907, a doped area 903, a doped area 904 and an epitaxial layer 905. The substrate 901 is a P-type doped silicon substrate. The doped well 902 is a P-type doped region and extends downwards into the substrate 901 from the surface 901a of the substrate 901 (referred as P well). The doped well 907 is doped with N-type dopants (referred as N well) and extends downwards into the substrate 901 from a surface 901a of the substrate 901.

The doped area 903 is a P-type area (referred as P+) extending downwards into the doped well 902 from the surface 901a and having a doping concentration substantially greater than that of the doped well 902. The doped area 904 is an N-type area (referred as N+) extending downwards into the doped well 902 from the surface 901a and separated from the doped area 903 by a STI 906.

The epitaxial layer 905 extends downwards into the doped well 907 from the surface 901a of the substrate 901 and is separated from the doped areas 904 and 903 by another STI 906. The epitaxial layer 905 comprises a doped area 905a, a doped area 905b and an isolating area 905c. The doped area 905a is an N-type area (referred as N+) having a doping concentration substantially greater than that of the doped well 907; and the doped area 905b is a P-type area (referred as P+). The isolating area 905c is used to separate the doped area 905a, the doped area 905b and the doped well 907 from each other.

In some embodiments of the present invention, the epitaxial layer 905 consists of SiC, wherein the isolating area 905c can be either undoped or doped with N-type dopants. In the present embodiment, the isolating area 905c is doped with N-type dopants having a concentration substantially less than that doped in the doped area 905a and the doped well 907.

By forming the aforementioned structure, a PNP BJT 910 equivalent circuit can be configured between the doped area 903, the doped well 902, the doped well 907, the isolating area 905c and the doped area 905b, and an NPN BJT 920 equivalent circuit can be configured between the doped area 904, the doped well 902, the doped well 907, the isolating area 905c and the doped area 905a, while a SCR device 900 is defined in the semiconductor ESD protection apparatus 90 used to provide ESD protection for other device (not shown) formed on the substrate 901.

In the present embodiment, the isolating area 905c, the doped well 907 and the doped well 902 respectively serve as the emitter, the base and the collector of the PNP BJT 910, and the doped area 904, the doped well 902 and the doped well 907 respectively serve as the emitter, the base and the collector of the NPN BJT 920. The doped area 903 and the doped area 904 are electrically in contact with the cathode of the SCR 900, and the doped 905a and the doped area 905b are electrically in contact with the anode of the SCR 900.

Since the isolating area 905c which is electrically connected to the anode (through the doped area 905a) and serves as the emitter of the PNP BJT 910 has a doping concentration less than that of the doped area 905a and the doped well 907, thus the resistance of the circuit used to connect the PNP BJT 910 with the anode of the SCR device 900 can be increased, such that the trigger voltage of the SCR device 900 can be decreased significantly.

In accordance with aforementioned embodiments, an improved semiconductor ESD protection apparatus which has a SCR device comprising a PNP BJT equivalent circuit and an NPN BJT equivalent circuit is provided, wherein at least one P/N junction in contact with the cathode/anode of the parasitic SCR device is formed by epitaxial material with a doping concentration less than that of the cathode/anode, whereby the resistance of the circuit used to connect the PNP/NPN BJT equivalent circuit with the cathode/anode can be increased, on one hand; and the carrier mobility of the PNP/NPN BJT equivalent circuit can be increased by the compression or tensile stress due to the formation of the epitaxial material in the silicon substrate, on another hand. As a result, the trigger voltage of the parasitic SCR device can be reduced significantly, so as to provide improved ESD protection for a semiconductor IC involving the semiconductor ESD protection apparatus therein. Therefore the process for fabricating the semiconductor IC can be simplified, and the layout size and the manufacturing cost of the semiconductor IC can be reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor electrostatic discharge (ESD) protection apparatus comprising:
    a substrate;
    a first doped well, disposed in the substrate and having a first conductivity;
    a first doped area, having the first conductivity and disposed in the first doped well;
    a second doped area, having a second conductivity and disposed in the first doped well;
    an epitaxial layer, disposed in the substrate and having a third doped area with the first conductivity and a fourth doped area with the second conductivity, wherein the third doped area and the fourth doped area are disposed in the first doped well and separated by a first isolating area having the second conductivity;
    a first bipolar junction transistor (BJT) equivalent circuit formed between the first doped area, the first doped well, the first isolating area and the third doped area; and
    a second BJT equivalent circuit formed between the second doped area, the first doped well and the first isolating area and the fourth doped area;
    wherein the first BJT equivalent circuit and the second BJT equivalent circuit have different majority carriers.

2. The semiconductor ESD protection apparatus according to claim 1, wherein the first isolating area has a doping concentration substantially less than that of the fourth doped area.

3. The semiconductor ESD protection apparatus according to claim 2, wherein the doping concentration of the first isolating area is substantially greater than 0.

4. The semiconductor ESD protection apparatus according to claim 2, wherein the epitaxial layer is made of silicon germanium (SiGe).

5. The semiconductor ESD protection apparatus according to claim 4, wherein the first conductivity is N-type and the second conductivity is P-type, whereby the first BJT equivalent circuit is an NPN BJT equivalent circuit and the second BJT equivalent circuit is a PNP BJT equivalent circuit.

6. The semiconductor ESD protection apparatus according to claim 5, wherein the second doped area consists of SiGe.

7. The semiconductor ESD protection apparatus according to claim 5, wherein the first doped area and the second doped area are involved in a silicon carbide (SiC) epitaxial layer; the SiC epitaxial layer further comprises a second isolating area used to separate the first doped area, the second doped area and the first doped well; and the second isolating area has a doping concentration substantially less than that of the first doped area.

8. The semiconductor ESD protection apparatus according to claim 7, wherein the second isolating area is an N-type area having the doping concentration substantially greater than or equal to 0.

9. The semiconductor ESD protection apparatus according to claim 4, further comprising a second doped well having the second conductivity and disposed in the substrate, wherein the epitaxial layer is disposed in the second doped well, and the first isolating area is used to separate the third doped area, the fourth doped area and the second doped well.

10. The semiconductor ESD protection apparatus according to claim 9, wherein the first conductivity is N-type and the second conductivity is P-type, whereby the first BJT equivalent circuit is an NPN BJT equivalent circuit and the second BJT equivalent circuit is a PNP BJT equivalent circuit.

11. The semiconductor ESD protection apparatus according to claim 2, wherein the epitaxial layer consists of SiC.

12. The semiconductor ESD protection apparatus according to claim 11, wherein the first conductivity is P-type and the second conductivity is N-type, whereby the first BJT equivalent circuit is a PNP BJT equivalent circuit and the second BJT equivalent circuit is an NPN BJT equivalent circuit.

13. The semiconductor ESD protection apparatus according to claim 12, wherein the second doped area consists of a SiC.

14. The semiconductor ESD protection apparatus according to claim 12, wherein the first doped area and the second doped area is involved in a SiC epitaxial layer; the SiC epitaxial layer further comprises a second isolating area used to separate the first doped area, the second doped area and the first doped well; and the second isolating area has a doping concentration substantially less than that of the first doped area.

15. The semiconductor ESD protection apparatus according to claim 14, wherein the second isolating area is a P-type area having the doping concentration substantially greater than or equal to 0.

16. The semiconductor ESD protection apparatus according to claim 11, further comprising a second doped well having the second conductivity and disposed in the substrate, wherein the epitaxial layer is disposed in the second doped well, and the first isolating area is used to separate the third doped area, the fourth doped area and the second doped well.

17. The semiconductor ESD protection apparatus according to claim 16, wherein the first conductivity is P-type and the second conductivity is N-type, whereby the first BJT equivalent circuit is a PNP BJT equivalent circuit and the second BJT equivalent circuit is an NPN BJT equivalent circuit.

18. The semiconductor ESD protection apparatus according to claim 17, wherein the first doped area and the second doped area are involved in a SiGe epitaxial layer, the SiGe epitaxial layer further comprises a second isolating area used to separate the first doped area, the second doped area and the first doped well; and the second isolating area has a doping concentration substantially less than that of the first doped area.

19. The semiconductor ESD protection apparatus according to claim 18, wherein the second isolating area is a P-type are having the doping concentration substantially greater than or equal to 0.

* * * * *